US010203597B2

(12) United States Patent
Miyazawa (10) Patent No.: US 10,203,597 B2
(45) Date of Patent: Feb. 12, 2019

(54) STRUCTURE-MANUFACTURING METHOD USING STEP-AND-REPEAT IMPRINTING TECHNIQUE

(71) Applicant: SOKEN CHEMICAL & ENGINEERING CO., LTD., Tokyo (JP)

(72) Inventor: Yukihiro Miyazawa, Saitama (JP)

(73) Assignee: SOKEN CHEMICAL & ENGINEERING Co., Ltd., Tokyo (JP)

( * ) Notice: Subject to any disclaimer, the term of this patent is extended or adjusted under 35 U.S.C. 154(b) by 302 days.

(21) Appl. No.: 15/038,276

(22) PCT Filed: Nov. 11, 2014

(86) PCT No.: PCT/JP2014/079804
§ 371 (c)(1),
(2) Date: May 20, 2016

(87) PCT Pub. No.: WO2015/076147
PCT Pub. Date: May 28, 2015

(65) Prior Publication Data
US 2016/0299425 A1    Oct. 13, 2016

(30) Foreign Application Priority Data

Nov. 22, 2013  (JP) ................................ 2013-242157

(51) Int. Cl.
*B29C 35/08*        (2006.01)
*G03F 7/00*         (2006.01)
(Continued)

(52) U.S. Cl.
CPC ........ *G03F 7/0002* (2013.01); *B29C 35/0805* (2013.01); *B29C 59/022* (2013.01);
(Continued)

(58) Field of Classification Search
CPC .. G03F 7/0002; B29C 59/022; B29C 35/0805
See application file for complete search history.

(56) References Cited

U.S. PATENT DOCUMENTS

2007/0054097 A1* 3/2007 Suehira ............... B29C 35/0894
                                                428/195.1
2007/0164487 A1* 7/2007 Beck .................... B29C 43/003
                                                264/496
(Continued)

FOREIGN PATENT DOCUMENTS

JP    2009-023113 A    2/2009
JP    2010-258326 A    11/2010
(Continued)

OTHER PUBLICATIONS

International Search Report dated Feb. 24, 2015 in corresponding Application No. PCT/JP2014/079804; 1 pg.
(Continued)

*Primary Examiner* — Galen H Hauth
(74) *Attorney, Agent, or Firm* — Maier & Maier, PLLC (57) ABSTRACT

A method of manufacturing a structure for suppressing in-mask curing corrosion while minimizing influence on shape stability of a fine pattern to be transferred to a resin layer. A method of manufacturing a structure is provided including: lamination forming, forming a lamination including, on a transparent substrate, a resin layer of an imprinting photo curable resin composition containing a photopolymerizable monomer and 0.1 parts or more respectively of a photo initiator and a polymerization inhibitor based on 100 parts of the monomer; covering, pressing a fine pattern of a mold on the resin layer and covering the lamination with a shading mask to cause a part of a region where the mold is pressed on to be exposed; curing the resin layer in the exposed region by radiating curing light to the resin layer; and repeating steps by moving the mold to an uncured area.

4 Claims, 9 Drawing Sheets

(51) Int. Cl.
*B29C 59/02* (2006.01)
*B29K 33/04* (2006.01)
*B29K 105/00* (2006.01)

(52) U.S. Cl.
CPC .. *B29C 2035/0827* (2013.01); *B29K 2033/04* (2013.01); *B29K 2105/0002* (2013.01)

(56) References Cited

U.S. PATENT DOCUMENTS

| | | | | |
|---|---|---|---|---|
| 2009/0224436 | A1* | 9/2009 | Mikami | B82Y 10/00 264/447 |
| 2010/0189839 | A1 | 7/2010 | Sano et al. | |
| 2014/0285550 | A1* | 9/2014 | Kodama | B41J 2/04571 347/10 |

FOREIGN PATENT DOCUMENTS

| | | |
|---|---|---|
| JP | 2013-000944 A | 1/2013 |
| JP | 2013-170227 A | 9/2013 |
| JP | 2013-225625 A | 10/2013 |

OTHER PUBLICATIONS

Extended European Search Report dated Feb. 13, 2017, in connection with corresponding EP Application No. 14864768.8 (8 pgs.).

\* cited by examiner

Fig.5   FIRST EMBODIMENT

Fig.8

STRUCTURE-MANUFACTURING METHOD USING STEP-AND-REPEAT IMPRINTING TECHNIQUE

TECHNICAL FIELD

The present invention relates to a method of manufacturing a structure using a step and repeat imprint technique.

BACKGROUND ART

The imprint technique is a micromachining technique in which a mold having a fine pattern is pressed against a resin layer of a liquid resin and the like on a substrate to thus transfer the pattern of the mold to the resin layer. Such fine pattern includes those in the nanoscale at the 10 nm level and those in approximately 100 μm and is used in various fields, such as semiconductor materials, optical materials, storage media, micromachines, biotechnology, and environmental technology.

Molds having a fine pattern in nano order on the surface take time to form the pattern and thus are very expensive. It is therefore difficult to increase the size (increase the area) of such mold having a fine pattern in nano order on the surface.

In PTL 1, repeated imprint using a small mold while shifting the mold position not to overlap the processing area enables imprint in a large area (step and repeat method).

CITATION LIST

Patent Literature

[PTL 1] JP 2013-000944A

SUMMARY OF INVENTION

Technical Problem

In such step and repeat imprint technique, in a state where a small mold having a fine pattern is pressed against a resin layer of a large area, a procedure of curing the resin layer in an area pressed against the mold is repeated while changing the mold position to obtain a fine pattern of a large area. Since a good fine pattern is not obtained when the resin layer in a region not pressed against the mold is cured, curing of the resin layer in the region not pressed against the mold is suppressed in PTL 1 by increasing the oxygen concentration in the atmosphere.

Differently from PTL 1, the present inventor attempted to prevent curing of a resin layer in a region not pressed against a mold by pressing a mold against a part of a resin layer composed of a photo curable resin composition containing a photo initiator, and in a state of covering the resin layer in the region surrounding the mold with a shading mask, radiating curing light. However, as a result of an actual attempt at this method, due to the influence of stray light and the like, a phenomenon occurred that the resin layer was cured with a width of 1.5 mm or more even in the area covered with the shading mask. Hereinafter, such phenomenon is referred to as "in-mask curing corrosion".

In such state, the present inventor attempted to suppress in-mask curing corrosion by reducing the amount of curing light radiation or decreasing the amount of added photo initiator. As a result of employing these mechanisms, the in-mask curing corrosion was suppressed, whereas curing of the resin layer in the area where the mold was instead pressed against for the fine pattern was insufficient and a new problem arose that the shape stability of the fine pattern to be transferred to the resin layer reduced.

The present invention has been made in view of such circumstances and is to provide a method of manufacturing a structure that is capable of suppressing the in-mask curing corrosion while minimizing influence on shape stability of a fine pattern to be transferred to a resin layer.

Solution to Problem

According to the present invention, a method of manufacturing a structure is provided that includes: (a) forming a lamination including, on a transparent substrate, a resin layer of an imprinting photo curable resin composition containing a photopolymerizable monomer and 0.1 parts by mass or more respectively of a photo initiator and a polymerization inhibitor based on 100 parts by mass of the monomer; (b) pressing a fine pattern of a mold, having an area less than that of the resin layer and having the fine pattern, on the resin layer and covering the lamination with a shading mask to cause at least part of a region where the mold is pressed on in the resin layer to be an exposed region; (c) curing an area in the exposed region in the resin layer by radiating curing light to the resin layer; and (d) moving the mold to an uncured area in the resin layer and repeating steps (b) and (c) one or more times.

As another mechanism to suppress in-mask curing corrosion, the present inventor tried to add a relatively large amount of polymerization inhibitor to the photo curable resin composition constituting the resin layer to find out, in addition to suppression of in-mask curing corrosion, a phenomenon that the shape stability of the fine pattern barely decreased or did not decrease at all, and thus has come to complete the present invention.

Various embodiments of the present invention are exemplified below. Embodiments shown below may be combined with each other.

It is preferred that, in step (c), an area covered with the shading mask in the resin layer is cured in a width of 200 μm or less from an end of the shading mask. It is preferred that the shading mask is arranged on a side of the transparent substrate to cover the lamination, and the curing light is radiated from the side of the transparent substrate to the resin layer. It is preferred that a content of the polymerization inhibitor in the photo curable resin composition is 20 parts by mass or less based on 100 parts by mass of the monomer. It is preferred that mass of the polymerization inhibitor is 0.01 to 0.5 times mass of the photo initiator.

DESCRIPTION OF EMBODIMENTS

Preferred embodiments of the present invention are specifically described below with reference to the drawings.

1. First Embodiment

A method of manufacturing a structure in the first embodiment of the present invention is a method using a step and repeat imprint technique and includes steps of lamination forming, covering, curing, and repeating.

Each step is described below in detail using FIGS. 1 through 5.

(1) Lamination Forming Step

Figure 1:
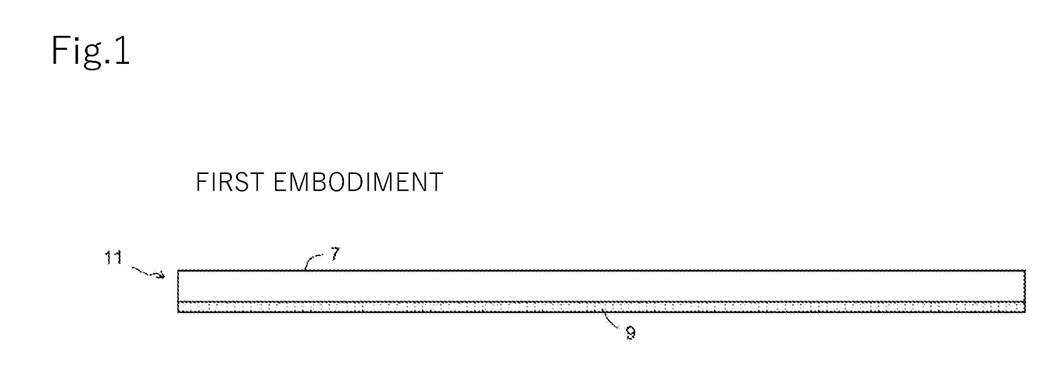
FIG. 1 is a cross-sectional view illustrating a step of lamination forming in a method of manufacturing a structure in a first embodiment of the present invention.

In this step, as illustrated in FIG. 1, a lamination 11 is formed that is provided with, on a transparent substrate 7, a resin layer 9 of an imprinting photo curable resin composition containing a photopolymerizable monomer and 0.1 parts by mass or more respectively of a photo initiator and a polymerization inhibitor based on 100 parts by mass of the monomer.

<Transparent Substrate>

The transparent substrate 7 is formed of a transparent material, such as a resin substrate and a quartz substrate, and although the material is not particularly limited, it is preferably a resin substrate. This is because, by using a resin substrate, a structure in desired size (available for a large area) is obtained by the imprint method of the present invention. A resin constituting the resin substrate is one selected from the group consisting of, for example, polyethylene terephthalate, polycarbonate, polyester, polyolefin, polyimide, polysulfone, polyethersulfone, cyclic polyolefin, and polyethylene naphthalate. The transparent substrate 7 preferably has adequate flexibility, and when a resin substrate is used, the resin substrate preferably has a thickness within a range from 25 to 500 μm.

<Photo Curable Resin Composition>

The imprinting photo curable resin composition constituting the resin layer 9 contains a monomer and 0.1 parts by mass or more respectively of a photo initiator and a polymerization inhibitor based on 100 parts by mass of the monomer, and has properties of curing by radiation of curing light (general term for energy rays capable of curing a resin such as UV light, visible light, and electron beam).

(a) Monomer

Examples of the monomer may include photopolymerizable monomers to form a (meth)acrylic resin, a styrene resin, an olefin resin, a polycarbonate resin, a polyester resin, an epoxy resin, a silicone resin, and the like, and a photopolymerizable (meth)acrylic monomer is preferred. The (meth) acryl herein means methacryl and/or acryl and (meth)acrylate means methacrylate and/or acrylate.

Examples of the photopolymerizable (meth)acrylic monomer may include multifunctional (meth)acrylic ester, monofunctional (meth)acrylic ester, and a functional group containing monomer.

Examples of the multifunctional (meth)acrylic ester used in the present invention may include ethylene oxide modified trimethylolpropane tri(meth)acrylate, ethylene oxide modified bisphenol A di(meth)acrylate, tripropylene glycol di(meth)acrylate, 1,4-butanediol di(meth)acrylate, 1,6-hexanediol di(meth)acrylate, 1,9-nonanediol di(meth)acrylate, (poly)ethylene glycol di(meth)acrylate, (poly)propylene glycol di(meth)acrylate, neopentyl glycol di(meth) acrylate, pentaerythritol di(meth)acrylate, pentaerythritol tri (meth)acrylate, pentaerythritol tetra(meth)acrylate, trimethylolpropane di(meth)acrylate, trimethylolpropane tri (meth)acrylate, polyester (meth)acrylate, urethane (meth) acrylate, and the like.

In the present invention, together with multifunctional (meth)acrylic ester as above, monofunctional (meth)acrylic ester may also be used. Examples of the monofunctional (meth)acrylic ester available here may include: (meth)acrylate having a linear alkyl group, such as methyl (meth) acrylate, ethyl (meth)acrylate, n-propyl (meth)acrylate, n-butyl (meth)acrylate, n-pentyl (meth)acrylate, n-hexyl (meth)acrylate, n-octyl (meth)acrylate, n-nonyl (meth)acrylate, decyl (meth)acrylate, dodecyl (meth)acrylate, and stearyl (meth)acrylate;

(meth)acrylic alkyl ester having a branched alkyl group, such as iso-propyl (meth)acrylate, iso-butyl (meth)acrylate, tert-butyl (meth)acrylate, 2-ethylhexyl (meth)acrylate, and isooctyl (meth)acrylate;

(meth)acrylic alkyl ester having a cyclic alkyl group, such as isobornyl (meth)acrylate and cyclohexyl (meth)acrylate; and (meth)acrylic ester having an aromatic ring group, such as benzyl (meth)acrylate and phenoxyethyl (meth)acrylate.

Examples of the functional group containing monomer may include a hydroxyl group containing monomer, an acid group containing monomer, an amino group containing monomer, an amide group containing monomer, and a cyano group containing monomer.

Here, examples of the hydroxyl group containing monomer may include hydroxyl group containing compounds, such as a hydroxyl group containing (meth)acrylic monomer like (meth)acrylic acid-2-hydroxyethyl, (meth)acrylic acid-2-hydroxypropyl, (meth)acrylic acid-4-hydroxybutyl, monoester of (meth)acrylic acid with polypropylene glycol or polyethylene glycol, and an addition of lactones with (meth)acrylic acid-2-hydroxyethyl.

In addition, examples of the acid group containing monomer may include carboxyl group containing (meth)acrylic monomers, such as (meth)acrylic acid, acid anhydride group containing (meth)acrylic monomers, phosphoric acid group containing (meth)acrylic monomers, and sulfuric acid group containing (meth)acrylic monomers.

Further, examples of the amino group containing monomer or the amide group containing monomer may include amino group containing (meth)acrylic monomers, such as N,N-dimethylaminoethyl (meth)acrylate, and amide group containing (meth)acrylic monomers, such as (meth)acrylamide, N-methyl (meth)acrylamide, N-ethyl (meth)acrylamide, N-propyl (meth)acrylamide, and N-hexyl (meth)acrylamide.

Moreover, examples of the cyano group containing monomer may include cyano (meth)acrylate and the like.

Further, examples of the (meth)acrylic monomer may include, other than the above (meth)acrylic monomers, another (meth)acrylic monomer, as described below, copolymerizable with the above (meth)acrylic monomers.

Examples of such another copolymerizable (meth)acrylic monomer may include epoxy group containing (meth)acrylate, such as glycidyl (meth)acrylate and 4-hydroxybutyl (meth)acrylate glycidyl ether, alkoxy (meth)acrylate, and allyl (meth)acrylate.

In 100 parts by mass of the (meth)acrylic monomers, the multifunctional (meth)acrylic ester is preferably from 50 to 100 parts by mass and more preferably from 70 to 100 parts by mass, the monofunctional (meth)acrylic ester is preferably from 0 to 30 parts by mass and more preferably from 0 to 20 parts by mass, the functional group containing monomer is preferably from 0 to 30 parts by mass and more preferably from 0 to 10 parts by mass, and the copolymerizable another (meth)acrylic monomer is preferably from 0 to 30 parts by mass and more preferably from 0 to 10 parts by mass. From the perspective of surface hardness, the (meth)acrylic monomer is preferably composed within the above range.

Among the above (meth)acrylic monomers, monomers of ethylene oxide modified trimethylolpropane triacrylate, ethylene oxide modified bisphenol A diacrylate, and tripropylene glycol diacrylate are preferred.

The imprinting photo curable resin composition of the present invention may contain, other than the (meth)acrylic monomer, another photopolymerizable monomer without impairing the properties of the present invention. Examples of such another photopolymerizable monomer may include a styrene-based monomer and a vinyl-based monomer.

Here, examples of the styrene-based monomer may include: alkylstyrene, such as styrene, methylstyrene, dimethylstyrene, trim ethylstyrene, ethylstyrene, diethylstyrene, triethylstyrene, propylstyrene, butylstyrene, hexylstyrene, heptylstyrene, and octylstyrene; styrene halide, such as fluorostyrene, chlorostyrene, bromostyrene, dibromostyrene, and iodostyrene; nitrostyrene; acetylstyrene; methoxystyrene; and the like.

Examples of the vinyl-based monomer may include: vinylpyridine, vinylpyrrolidone, vinylcarbazole, divinylbenzene, vinyl acetate, and acrylonitrile; conjugated diene monomers, such as butadiene, isoprene, and chloroprene; vinyl halide, such as vinyl chloride and vinyl bromide; vinylidene halide, such as vinylidene chloride; and the like.

(b) Photo Initiator

The photo initiator is a component added to promote polymerization of the monomer and is contained 0.1 parts by mass or more based on 100 parts by mass of the monomer. Although the upper limit of the content of the photo initiator is not particularly defined, it is, for example, 20 parts by mass based on 100 parts by mass of the monomer. The content of the photo initiator is specifically, for example, 0.1, 0.5, 1, 2, 3, 4, 5, 6, 7, 8, 9, 10, 15, or 20 parts by mass based on 100 parts by mass of the monomer and may be within a range between any two of the numerical values exemplified here. Although the type of photo initiator is not particularly limited, an alkylphenon-based photo initiator (B1) and an acylphosphine oxide-based photo initiator (B2) are preferably used in combination.

The alkylphenon-based photo initiator (B1) and the acylphosphine oxide-based photo initiator (B2) are used in combination as the photo initiator, thereby adequately reducing the polymerization rate to cause the unpolymerized resin composition to enter between the resin shrunk by the polymerization and the master mold for polymerization. It is thus possible to reduce curing shrinkage of the structure obtained by photo curing of the composition of the present invention. In addition, since the resin polymerized later sufficiently forms a crosslinking structure on the surface, it has hardness higher than that of the resin polymerized earlier and thus the surface hardness is considered to be increased.

In the present invention, regarding the amounts of both photo initiators used in the imprinting photo curable resin composition, the alkylphenon-based photo initiator (B1) is used preferably from 0.1 to 15 parts by mass and even more preferably from 0.5 to 10 parts by mass based on 100 parts by mass of the monomer in the imprinting photo curable resin composition, and the acylphosphine oxide-based photo initiator (B2) is used preferably from 0.1 to 15 parts by mass and even more preferably from 0.5 to 10 parts by mass.

Use of the alkylphenon-based photo initiator (B1) and the acylphosphine oxide-based photo initiator (B2) within the above ranges enables control of the amount of generated radicals.

A weight ratio (B1:B2) of the alkylphenon-based photo initiator (B1) to the acylphosphine oxide-based photo initiator (B2) is from 1:99 to 90:10, preferably from 5:95 to 80:20, more preferably from 10:90 to 70:30, and most preferably from 10:90 to 40:60.

Use of the alkylphenon-based photo initiator (B1) and the acylphosphine oxide-based photo initiator (B2) in the above weight ratio enables formation of a relatively rigid polymer by adequately reducing the polymerization rate and also enables suppression of yellowing of the obtained polymer.

The alkylphenon-based photo initiator is preferably a compound not containing nitrogen, more preferably at least one selected from the group consisting of 2,2-dimethoxy-1, 2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-propane-1-one, and 2-hydroxy-1-{[4-(2-hydroxy-2-methyl-propionyl)-benzyl]phenyl}-2-methyl-propane-1-one, and most preferably 1-hydroxy-cyclohexyl-phenyl-ketone.

Commercially available examples of the alkylphenon-based photo initiator may include IRGACURE 651, IRGACURE 184, IRGACURE 2959, IRGACURE 127, IRGACURE 907, IRGACURE 369 (all produced by BASF SE) and IRGACURE 1173 (produced by Ciba Japan K.K.).

The acylphosphine oxide-based photo initiator is preferably at least one selected from the group consisting of 2,4,6-trimethylbenzoyl-diphenyl-phosphine oxide and bis(2,4,6-trimethylbenzoyl)-phenylphosphine oxide and most preferably bis(2,4,6-trimethylbenzoyl)-phenylphosphine oxide.

Commercially available examples of the acylphosphine oxide-based photo initiator may include LUCIRIN TPO and IRGACURE 819 (both produced by BASF SE).

(c) Polymerization Inhibitor

The polymerization inhibitor is a component added to suppress polymerization of the monomer and is added to suppress in-mask curing corrosion. The polymerization inhibitor is contained 0.1 parts by mass or more based on 100 parts by mass of the monomer. Although the upper limit of the content of the polymerization inhibitor is not particularly defined, it is, for example, 20 parts by mass based on 100 parts by mass of the monomer. The content of the photo initiator is specifically, for example, 0.1, 0.5, 1, 2, 3, 4, 5, 6, 7, 8, 9, 10, 15, or 20 parts by mass based on 100 parts by mass of the monomer and may be within a range between any two of the numerical values exemplified here. When the content of the polymerization inhibitor is excessively large compared with the content of the photo initiator, polymerization of the monomer is sometimes not started or becomes insufficient. The mass ratio of the polymerization inhibitor/photo initiator is thus preferably from 0.01 to 0.5. The mass ratio is 0.01, 0.02, 0.05, 0.1, 0.2, 0.3, 0.4, or 0.5 and may be within a range between any two of the numerical values exemplified here.

Although the type of polymerization inhibitor is not particularly limited, examples of it may include specifically, for example, in addition to phenothiazine, benzoquinone, hydroquinone, naphthoquinone, p-methoxyphenol, hydroquinone monomethyl ether, t-butylhydroquinone, t-butylcatechol, N-methyl-N-nitrosoaniline, N-phenylnaphthylamine, 2,2,6,6-tetramethylpiperidine-1-oxyl, and 4-hydroxy-2,2,6,6-tetramethylpiperidine-1-oxyl, commercially available products, such as Q-1300 and Q-1301 produced by Wako Pure Chemical Industries, Ltd. and Quino Power QS-W10 and Quino Power QS-30 produced by Kawasaki Kasei Chemicals Ltd. Among all, benzoquinone or 4-hydroxy-2,2,6,6-tetramethylpiperidine-1-oxyl is preferred.

(d) Other Components

The imprinting photo curable resin composition of the present invention may contain components, such as a solvent, a chain transfer agent, an antioxidant, a photosensitizer, a filler, and a leveling agent, without affecting the properties of the imprinting photo curable resin composition.

It is possible to manufacture the imprinting photo curable resin composition of the present invention by mixing the above components in a known method.

The imprinting photo curable resin composition of the present invention is applied on the transparent substrate 7 in a method of spin coating, spray coating, bar coating, dip coating, die coating, slit coating, or the like to form the resin layer 9, thereby obtaining the lamination 11 provided with the resin layer 9 on the transparent substrate 7.

(2) Covering Step

Figure 2:
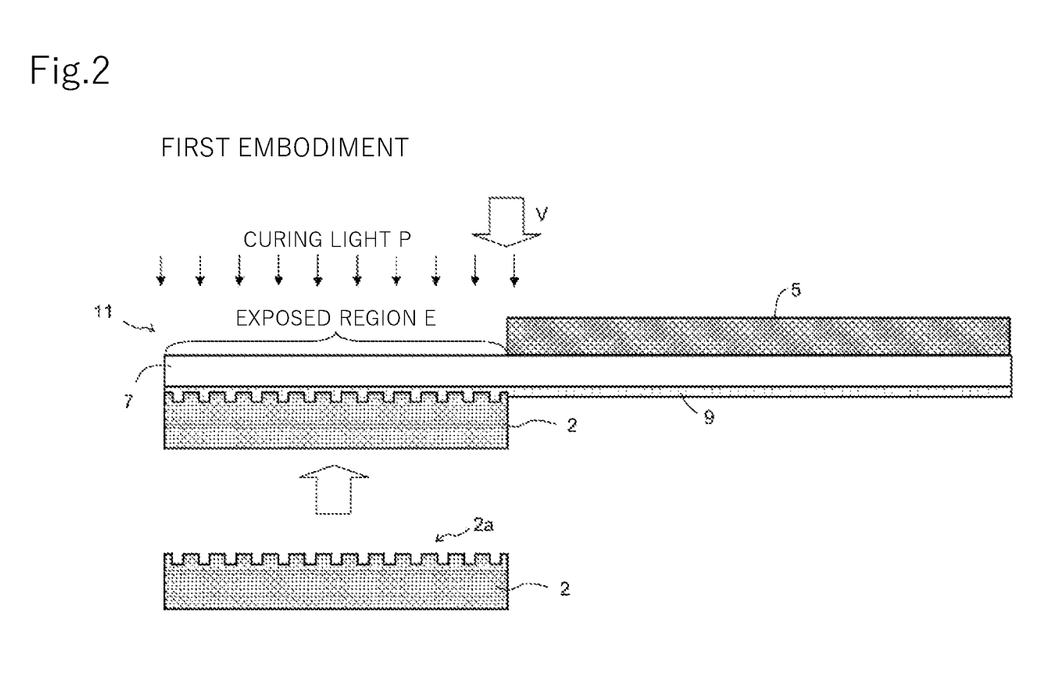
FIG. 2 is a cross-sectional view illustrating steps of covering and curing in the method of manufacturing a structure in the first embodiment of the present invention.

In this step, as illustrated in FIG. 2, a fine pattern 2a of a mold 2, having an area less than that of the resin layer 9 and having the fine pattern 2a, is pressed on the resin layer 9 and the lamination 11 is covered with a shading mask 5 to cause at least part of a region where the mold 2 is pressed on in the resin layer 9 to be an exposed region E;

<Mold>

The mold 2 has the fine pattern 2a, and by curing the resin layer 9 in a state where the fine pattern 2a is pressed on the resin layer 9, a cured resin layer 10 having a reverse pattern 10a of the fine pattern 2a is formed.

In the present embodiment, the mold 2 is formed of a non-light transmissive material, such as metal (nickel), and curing light P is radiated to the resin layer 9 from the transparent substrate 7 side, whereas the mold 2 may be formed of a transparent material. It is possible to form the mold 2 made of a transparent material by, for example, forming a transparent resin layer on a transparent substrate and forming the fine pattern 2a in the transparent resin layer. When the mold 2 is made of a transparent material, the curing light P may be radiated from the resin layer 9 side to radiate the curing light P to the resin layer 9 via the mold 2. In this case, the shading mask 5 is also arranged on the resin layer 9 side.

Although the shape of fine pattern 2a is not particularly limited, it is normally concave and convex and is a pattern repeated on a regular cycle. It preferably has a cycle from 10 nm to 2 mm, a depth from 10 nm to 500 µm, and a transfer surface from 1.0 to $1.0 \times 10^6$ mm$^2$ and more preferably has a cycle from 20 nm to 20 µm, a depth from 50 nm to 1 µm, and a transfer surface from 1.0 to $0.25 \times 10^6$ mm$^2$. Such setting enables transfer of the fine pattern 2a sufficiently to the resin layer 9. Examples of the specific concave and convex shape may include a moth eye structure, lines, columns, monoliths, circular cones, polygonal pyramids, and microlenses.

The fine pattern 2a has a surface that may be subjected to release treatment for prevention of adhesion to the resin layer 9, and the release treatment may form a release layer (not shown). A mold release agent to form the release layer (not shown) is preferably made of at least one selected from the group consisting of a fluorine-based silane coupling agent, a perfluoro compound having an amino group or a carboxyl group, and a perfluoroether compound having an amino group or a carboxyl group, and more preferably made of at least one selected from the group consisting of a simple substance or a mixture of a simple substance and a composite of a fluorine-based silane coupling agent, a one-terminal aminated perfluoro (perfluoroether) compound, and a one-terminal carboxylated perfluoro (perfluoroether) compound. Use of above as the mold release agent results in good close adhesion to the mold 2 and good release properties from the resin to be imprinted. The release layer (not shown) has a thickness within a range preferably from 0.5 to 20 nm, more preferably from 0.5 to 10 nm, and most preferably from 0.5 to 5 nm. In order to improve the close adhesion of the release layer to the mold 2, an additive having a group capable of being bonded to the mold release agent as disclosed in WO2012/018045 may be added to the transparent resin layer.

<Shading Mask>

Figure 6:
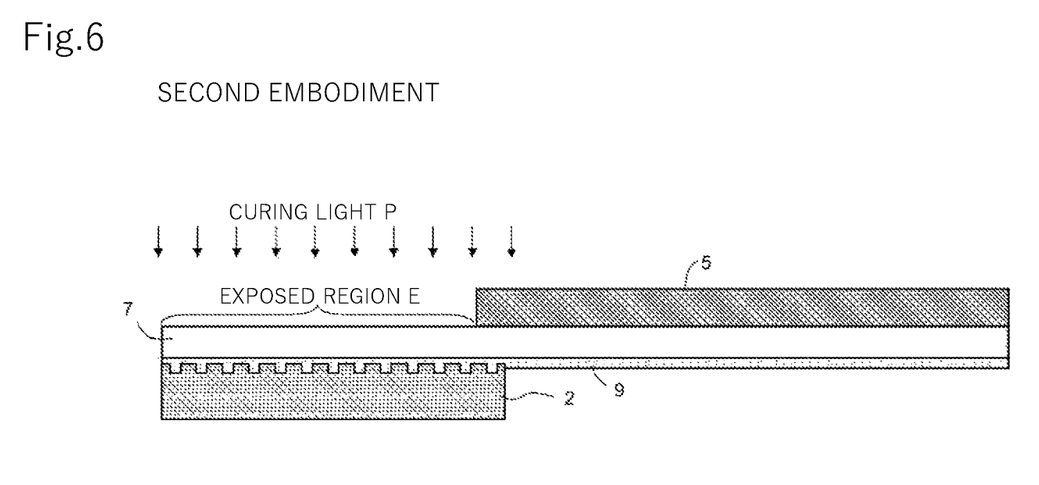
FIG. 6 is a cross-sectional view illustrating steps of covering and curing in a method of manufacturing a structure in a second embodiment of the present invention.

The shading mask 5 is made of a shading material and is fixed to the lamination 11 by being attached on, for example, the transparent substrate 7 side of the lamination 11. In the present embodiment, the shading mask 5 is arranged in planar view (viewed from an arrow V direction in FIG. 2) in such a manner that an end of the shading mask 5 approximately coincides with an end of the mold 2 not to cause the shading mask 5 to overlap the mold 2 in planar view. In the resin layer 9, the entire region where the mold 2 is pressed on is, therefore, the exposed region E. As illustrated in FIG. 6, the shading mask 5 may be arranged in planar view in such a manner that the shading mask 5 partially overlaps the mold 2. In this case, in the resin layer 9, a partial region where the mold 2 is pressed on (the area not covered with the shading mask 5) becomes the exposed region E.

(3) Curing Step

In the curing step, as illustrated in FIG. 2, by radiating the curing light P to the resin layer 9, the area in the exposed region E of the resin layer 9 is cured. The resin layer 9 is thus cured in a state where the fine pattern 2a of the mold 2 is transferred, and as illustrated in FIGS. 3 through 4, the cured resin layer 10 having the reverse pattern 10a of the fine pattern 2a is formed.

The curing light P is a general term for energy rays, such as UV light, visible light, and electron beam, that are capable of curing a resin. The curing light P may be radiated in an amount of the integral light to sufficiently cure the area in the exposed region E of the resin layer 9. The amount of the integral light is, for example, from 100 to 10000 mJ/cm$^2$ and specifically, for example, 100, 150, 200, 250, 300, 350, 400, 450, 500, 1000, 1500, 2000, 2500, 3000, 4000, 5000, and 10000 mJ/cm$^2$ and may be within a range between any two of the numerical values exemplified here.

Figure 3:
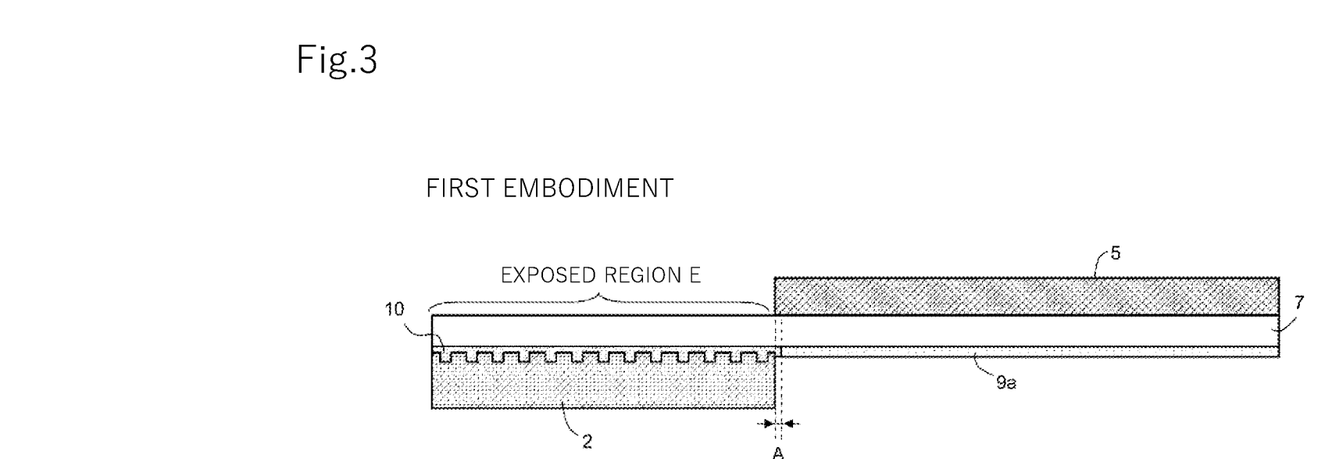
FIG. 3 is a cross-sectional view illustrating a state of the lamination after the step of curing in the method of manufacturing a structure in the first embodiment of the present invention.
Figure 4:
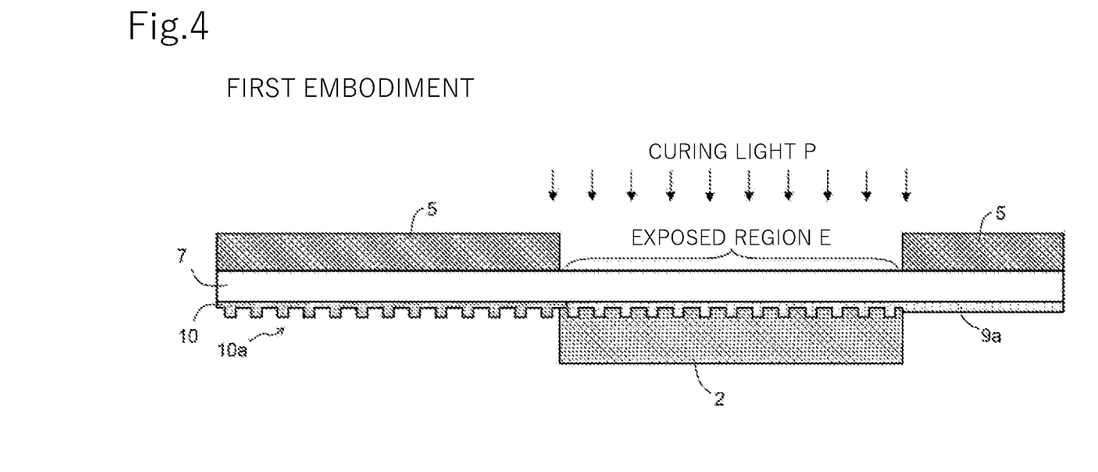
FIG. 4 is a cross-sectional view illustrating a step of repeating in the method of manufacturing a structure in the first embodiment of the present invention.
Figure 7:
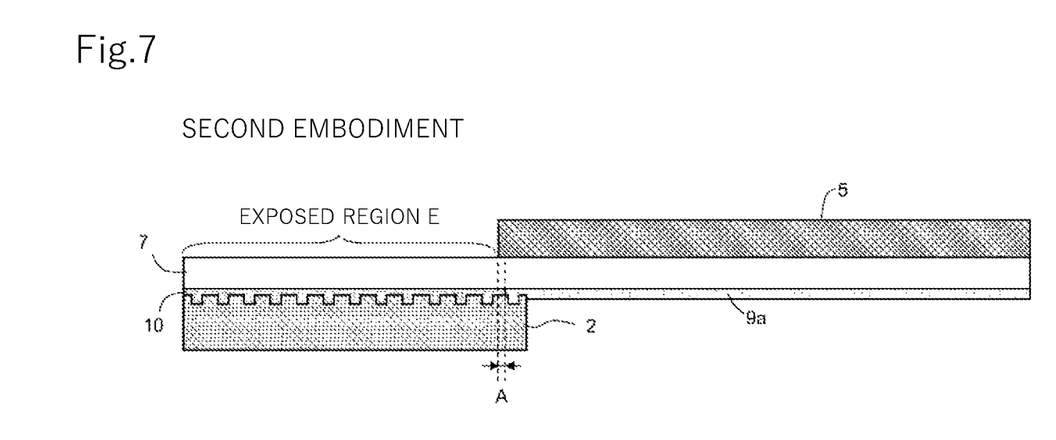
FIG. 7 is a cross-sectional view illustrating a state of the lamination after the step of curing in the method of manufacturing a structure in the second embodiment of the present invention.
Figure 9:
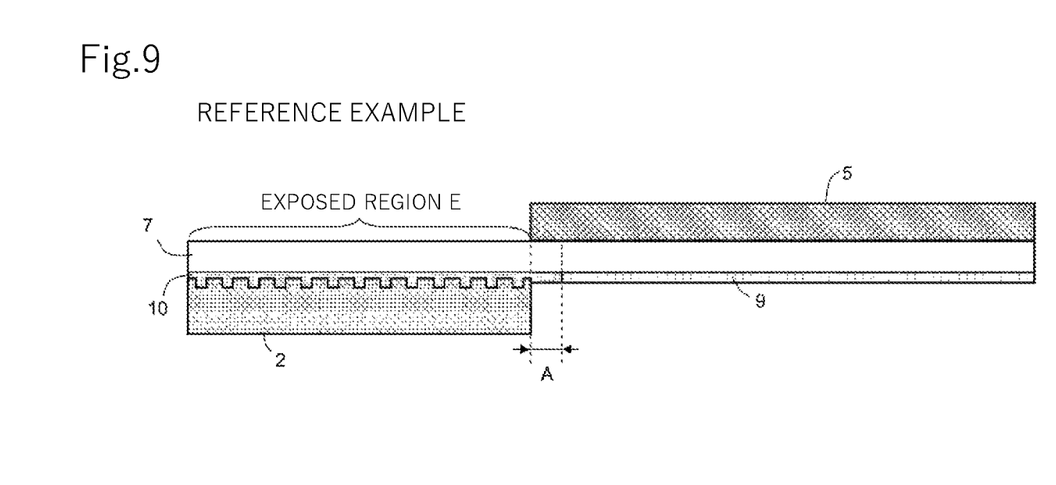
FIG. 9 is a cross-sectional view corresponding to FIGS. 3 and 7 in a reference example.

When the curing light P is radiated to the resin layer 9, due to stray light generated by reflection, scattering, diffraction, or the like of the curing light P in various members, as indicated by broken lines in FIGS. 3, 7, and 9, the "in-mask curing corrosion" phenomenon occurs in which the area covered with the shading mask 5 in the resin layer 9 (covered area) is cured in a range of a corrosion width A. When a photo curable resin composition barely containing or not at all containing a polymerization inhibitor is used as a material for the resin layer 9, as illustrated in a reference example of FIG. 9, the corrosion width A is a very large value, such as 1.5 mm, for example. In contrast, in the present embodiment, as illustrated in FIG. 3, by forming the resin layer using the photo curable resin composition with a specified amount of polymerization inhibitor, the in-mask curing corrosion is suppressed and the corrosion width A decreases significantly.

(4) Repeating Step

The repeating step includes a step of repeating the covering step and the curing step one or more times by moving the mold 2 to an uncured area 9a of the resin layer 9.

In this step, as illustrated in FIG. 3, the mold 2 in contact with the cured resin layer 10 is separated from the cured resin layer 10 and the mold 2 is moved to the uncured area 9a of the resin layer 9 to, as illustrated in FIG. 4, press the mold 2 on the uncured area 9a. Then, as illustrated in FIG. 4, the shading mask 5 is arranged in such a manner that at least part of the region of the resin layer 9 where the mold 2 is pressed on becomes the exposed region E, and in this state, the curing light P is radiated to the resin layer 9 to form the cured resin layer 10 having the reverse pattern 10a.

As illustrated in FIGS. 3 through 4, when the mold 2 is moved to be pressed on the uncured area 9a in a position adjacent to the cured resin layer 10, the mold 2 turns out to be pressed to squash the resin layer 9 in the area of the corrosion width A. However, according to the present embodiment, the corrosion width A is so small that the resin layer 9 in that area is readily squashed, and thus manufacture of a structure by a step and repeat method is barely or not at all affected. The mold 2 may be pressed on the uncured area 9a of the resin layer 9 to avoid the resin layer 9 in the area of the corrosion width A.

In FIG. 4, excessive radiation of the curing light P after curing of the resin layer 9 is prevented by covering the cured resin layer 10 with the shading mask 5, whereas the cured resin layer 10 does not have to be covered with the shading mask 5.

Figure 5:
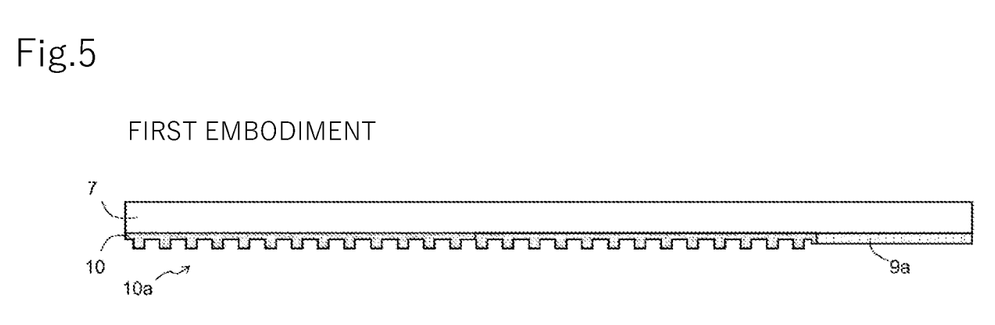
FIG. 5 is a cross-sectional view illustrating a structure obtained by the method of manufacturing a structure in the first embodiment of the present invention.

After the curing step illustrated in FIG. 4, a state where the shading mask 5 and the mold 2 are removed is illustrated in FIG. 5. From this state, the uncured area 9a of the resin layer 9 is swept using an organic solvent, such as isopropyl alcohol, to obtain a structure with the cured resin layer 10 having the reverse pattern 10a formed on the transparent substrate 7.

This structure is used for applications, such as imprint molds, antireflection films, diffusion films, and cell culture sheets. For the imprint mold application, structures with a pattern that is formed on the surface and has a nano or micro concave and convex structure in various shapes suitable for the application are preferably used. For antireflection film application, structures with a pattern that is formed on the surface and has a moth eye shape are preferably used. For diffusion film application, structures with a pattern that is formed on the surface and has a microlense array shape are preferably used.

2. Second Embodiment

Figure 8:
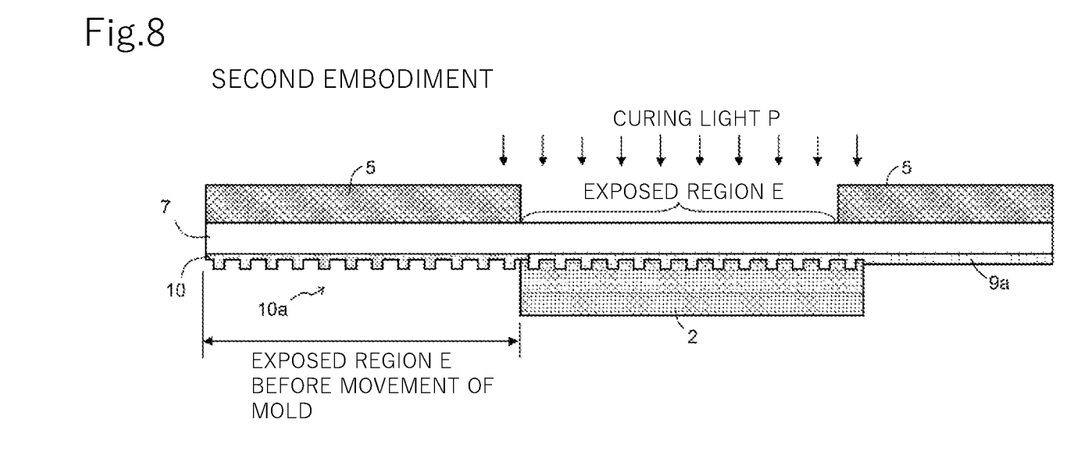
FIG. 8 is a cross-sectional view illustrating a step of repeating in the method of manufacturing a structure in the second embodiment of the present invention.

Using FIGS. 6 through 8, a second embodiment of the present invention is described. While a method of manufacturing a structure in the present embodiment is similar to that in the first embodiment, as illustrated in FIG. 6, it is characterized in that the shading mask 5 is arranged to partially overlap the mold 2 in planar view, and thus the descriptions are given below mainly on this point.

In the first embodiment, the entire region where the mold 2 is pressed on in the resin layer 9 (mold pressing region) is the exposed region E, whereas in the present embodiment, only part of the mold pressing region is the exposed region E. Therefore, even when the curing light P is radiated to the exposed region E as illustrated in FIG. 6, part of the mold pressing region (right end portion of the mold 2 in FIGS. 6 through 7 in the present embodiment) remains uncured as illustrated in FIG. 7.

Then, when the mold 2 is moved, as illustrated in FIG. 8, the mold 2 is moved and the shading mask 5 is arranged not to create a gap between the exposed regions E before and after the movement of the mold 2, thereby not leaving the uncured area 9a between the adjacent cured resin layers 10. The ends of the adjacent exposed regions E coincide with each other in FIG. 8, whereas the adjacent exposed regions E may partially overlap.

EXAMPLES

Examples and Comparative Examples of the present invention are described below.

Firstly, a fine pattern (moth eye pattern with a shape height of 339 nm and a cycle of 350 nm) of a master mold (square of 100 mm×100 mm) made of nickel was subjected to release treatment with a fluorine-based mold release agent (OPTOOL HD-2100, produced by Daikin Industries, Ltd.).

Then, a photo curable resin composition with a polymerization inhibitor and a photo initiator indicated in Table 1 with the parts by mass indicated in Table 1 based on a monomer (100 parts by mass in total) composed of 75 parts by mass of tripropylene glycol diacrylate, 20 parts by mass of methyl methacrylate, and 5 parts by mass of glycidyl methacrylate was applied on a transparent substrate made of PET (polyethylene terephthalate) in a thickness of 10 μm in a range of 120 mm×120 mm to form a resin layer and the fine pattern of the master mold was pressed against the resin layer.

Then, a shading mask to block UV light was attached on the transparent substrate 7 side to overlap with a width of 10 mm in planar view from an end of each side of the master mold. The ends of the master mold were thus covered with the shading mask with a width of 10 mm in planar view to form an exposed region of 80 mm×80 mm at the center.

After that, UV light was radiated in the amount of the integral light indicated in Table 1 by a UV irradiation device (manufactured by Technovision, Inc., model: UVC-408) to cure the resin, followed by releasing the lamination of PET/the cured resin from the master mold to obtain a sample. The uncured area in the resin layer surrounding the exposed region was swept using isopropyl alcohol. The sample thus obtained is referred to below as a "structure".

The structure thus obtained was observed under an optical microscope to measure the corrosion width from an end of the shading mask. In addition, the moth eye pattern was observed under an electron microscope to evaluate the shape stability based on the following criteria.

(Shape Stability)

○: Shape collapse was not observed

×: Shape collapse was observed

TABLE 1

| Table 1 | | Examples | | | | Comparative Examples | | | | |
|---|---|---|---|---|---|---|---|---|---|---|
| | | 1 | 2 | 3 | 4 | 1 | 2 | 3 | 4 | 5 |
| Polymerization Inhibitor | OH-TEMPO | 0.1 | 0.5 | | | | 0.05 | | | |
| | PBQ | | | 0.1 | 0.5 | | | 0.05 | | |
| Photo Initiator | IRGACURE 184 | 1 | 1 | 1 | 1 | 1 | 1 | 1 | 1 | 0.5 |
| | IRGACURE 819 | 5 | 5 | 5 | 5 | 5 | 5 | 5 | 5 | 2.5 |
| Mass Ratio of Polymerization Inhibitor/Photo Initiator | | 0.017 | 0.083 | 0.017 | 0.083 | 0 | 0.008 | 0.008 | 0 | 0 |
| Amount of UV Integral Light (mJ/cm$^2$) | | 200 | 200 | 200 | 200 | 200 | 200 | 200 | 100 | 200 |
| Evaluation | Corrosion Width [μm] | 200 | 50 | 100 | 30 | 1600 | 500 | 300 | 1000 | 1200 |
| | Shape Stability | ○ | ○ | ○ | ○ | ○ | ○ | ○ | X | X |

Abbreviations in Table 1 denote as follows.
OH-TEMPO: 4-hydroxy-2,2,6,6-tetramethylpiperidinyl-1-oxyl
PBQ: p-benzoquinone
IRGACURE 184: 1-hydroxy-cyclohexyl phenyl ketone (produced by BASF SE)
IRGACURE 819: bis(2,4,6-trimethylbenzoyl)phenylphosphine oxide (produced by BASF SE)

(Discussion)

As illustrated in, when a photo curable resin composition not containing a polymerization inhibitor is used, the shape stability of the reverse pattern formed in the structure was good but the corrosion width was very large as 1600 μm.

In order to improve this state, in Comparative Examples 2 thorough 3, 0.05 parts by mass of a polymerization inhibitor was added based on 100 parts by mass of the monomer but the corrosion width was not sufficiently small though somewhat decreased.

In Comparative Example 4, the corrosion width was attempted to be decreased by reducing the amount of the integral light instead of adding the polymerization inhibitor. Although the corrosion width was slightly improved, curing of the resin was insufficient and shape collapse occurred.

In Comparative Example 5, the corrosion width was attempted to be decreased by reducing the photo initiator instead of adding the polymerization inhibitor. Although the corrosion width was slightly improved, curing of the resin was insufficient and shape collapse occurred.

In contrast, in Examples 1 through 4 using a photo curable resin composition containing 0.1 parts by mass or more respectively of the photo initiator and the polymerization inhibitor based on 100 parts by mass of the monomer, the corrosion width was sufficiently small without affecting the shape stability.

REFERENCE SIGNS LIST

2: Mold, 2a: Fine Pattern, 5: Shading Mask, 7: Transparent Substrate, 9: Resin Layer, 10: Cured Resin Layer, 10a: Reverse Pattern, 11: Lamination

The invention claimed is:

1. A method of manufacturing a structure, comprising:
   (a) forming a lamination including, on a transparent substrate, a resin layer of an imprinting photo curable resin composition containing a photopolymerizable monomer and 0.1 parts by mass or more respectively of a photo initiator and a polymerization inhibitor based on 100 parts by mass of the monomer;
   (b) pressing a fine pattern of a mold, having an area less than that of the resin layer and having the fine pattern, on the resin layer and covering the lamination with a shading mask to cause at least part of a region where the mold is pressed on in the resin layer to be an exposed region;
   (c) curing an area in the exposed region in the resin layer by radiating curing light to the resin layer; and
   (d) moving the mold to an uncured area in the resin layer and repeating steps (b) and (c) one or more times,
   wherein the shading mask is arranged on a side of the transparent substrate to cover the lamination, and
   the curing light is radiated from the side of the transparent substrate to the resin layer.

2. The method of manufacturing a structure according to claim 1, wherein, in step (c), an area covered with the shading mask in the resin layer is cured in a width of 200 μm or less from an end of the shading mask.

3. The method of manufacturing a structure according to claim 1, wherein a content of the polymerization inhibitor in the photo curable resin composition is 20 parts by mass or less based on 100 parts by mass of the monomer.

4. The method of manufacturing a structure according to claim 1, wherein mass of the polymerization inhibitor is 0.01 to 0.5 times mass of the photo initiator.

* * * * *